(12) United States Patent
Yotsuya

(10) Patent No.: US 6,893,575 B2
(45) Date of Patent: May 17, 2005

(54) MASK AND METHOD OF MANUFACTURING THE SAME, ELECTROLUMINESCENCE DEVICE AND METHOD OF MANUFACTURING THE SAME, AND ELECTRONIC INSTRUMENT

(75) Inventor: Shinichi Yotsuya, Suwa (JP)

(73) Assignee: Seiko Epson Corporation, Tokyo (JP)

(*) Notice: Subject to any disclaimer, the term of this patent is extended or adjusted under 35 U.S.C. 154(b) by 302 days.

(21) Appl. No.: 10/246,731

(22) Filed: Sep. 19, 2002

(65) Prior Publication Data

US 2003/0054646 A1 Mar. 20, 2003

(30) Foreign Application Priority Data

Sep. 20, 2001 (JP) ....................... 2001-287019

(51) Int. Cl.[7] .............. B44C 1/22; C23F 3/00; G03F 9/00
(52) U.S. Cl. ............................. 216/12; 430/5
(58) Field of Search ............... 216/2, 12, 17, 216/41, 94, 99; 438/690, 700, 753; 430/5, 6, 7; 219/121.7, 121.71

(56) References Cited

U.S. PATENT DOCUMENTS 5,883,012 A * 3/1999 Chiou et al. ............... 438/748
6,059,981 A * 5/2000 Nakasuji .................... 216/2

FOREIGN PATENT DOCUMENTS

| JP | 53-79775 | 7/1978 |
| JP | A 57-126967 | 8/1982 |
| JP | 04-236758 | 8/1992 |
| JP | A 8-85868 | 4/1996 |
| JP | A 8-176799 | 7/1996 |
| JP | A 11-187214 | 7/1999 |
| JP | 3024641 | 1/2000 |
| JP | A 2000-133443 | 5/2000 |
| JP | 2001-185350 | 7/2001 |
| JP | A 2001-195009 | 7/2001 |
| JP | 2002-047560 | 2/2002 |
| JP | A 2002-313564 | 10/2002 |

OTHER PUBLICATIONS

U.S. Appl. No. 10/247,570, filed Sep. 20, 2000, Shinichi Yotsuya.

U.S. Appl. No. 10/247,360, filed Sep. 20, 2002, Shinichi Yotsuya.

* cited by examiner

*Primary Examiner*—Gregory Mills
*Assistant Examiner*—Roberts Culbert
(74) *Attorney, Agent, or Firm*—Oliff & Berridge, PLC

(57) ABSTRACT

A mask has a monocrystal substrate having opposite surfaces which are planes having Miller indices {110}. A plurality of penetrating holes are formed in the monocrystal substrate. An opening shape of each of the penetrating holes is a polygon and each side of the polygon is parallel with a plane in a group of the {111} planes. The wall surfaces of the penetrating holes are the {111} planes. In the method of manufacturing a mask, openings are formed in the etching resistant film corresponding to the shape of the penetrating holes and the monocrystal substrate is etched.

15 Claims, 8 Drawing Sheets

MASK AND METHOD OF MANUFACTURING THE SAME, ELECTRO-LUMINESCENCE DEVICE AND METHOD OF MANUFACTURING THE SAME, AND ELECTRONIC INSTRUMENT

Japanese Patent Application No. 2001-287019, filed on Sep. 20, 2001, is hereby incorporated by reference in its entirety.

BACKGROUND OF THE INVENTION

The present invention relates to a mask and its manufacturing method, an electro-luminescence device and its manufacturing method, and an electronic instrument.

A mask with high precision is required. For example, a method of manufacturing a color organic electro-luminescence (hereinafter called EL) device that is known uses a mask to deposit an organic material of each color. Though a method in which a base is etched is known as one of the methods of manufacturing a mask, it was difficult to manufacture a mask with high precision in the conventional method.

BRIEF SUMMARY OF THE INVENTION

According to a first aspect of the present invention, there is provided a method of manufacturing a mask comprising:

forming an etching resistant film having a plurality of openings having a polygonal shape on surfaces of a monocrystal substrate having Miller indices {110}, each side of the openings being parallel to one of the {111} planes; and forming a plurality of penetrating holes in the monocrystal substrate within the openings by etching;

wherein the etching has a crystal orientation dependence that the etching speed with respect to the {111} planes is slower than the etching speed with respect to the {100} and {110} planes.

According to a second aspect of the present invention, there is provided a mask comprising:

a monocrystal substrate having opposite surfaces having Miller indices {110}; and a plurality of penetrating holes formed in the monocrystal substrate, wherein the openings have a polygonal shape, each side of the openings being parallel to a plane in a group of the {111} planes; and wherein inside walls of the penetrating holes are the {111} planes.

According to a third aspect of the present invention, there is provided a method of manufacturing an electro-luminescence device comprising forming a film of a light emitting material using the above-described mask.

An electro-luminescence device according to a fourth aspect of the present invention is manufactured by the above method.

An electro-luminescence device according to a fifth aspect of the present invention comprises a plurality of light emitting layers each having an upper surface formed in a polygonal shape except a rectangle, and the angle of each corner of the polygonal shape is substantially equal to the intersection angle between two planes among the planes having Miller indices {111}.

An electronic instrument according to a sixth aspect of the present invention has the electro-luminescence device.

DETAILED DESCRIPTION OF THE EMBODIMENTS

Figure 1A:
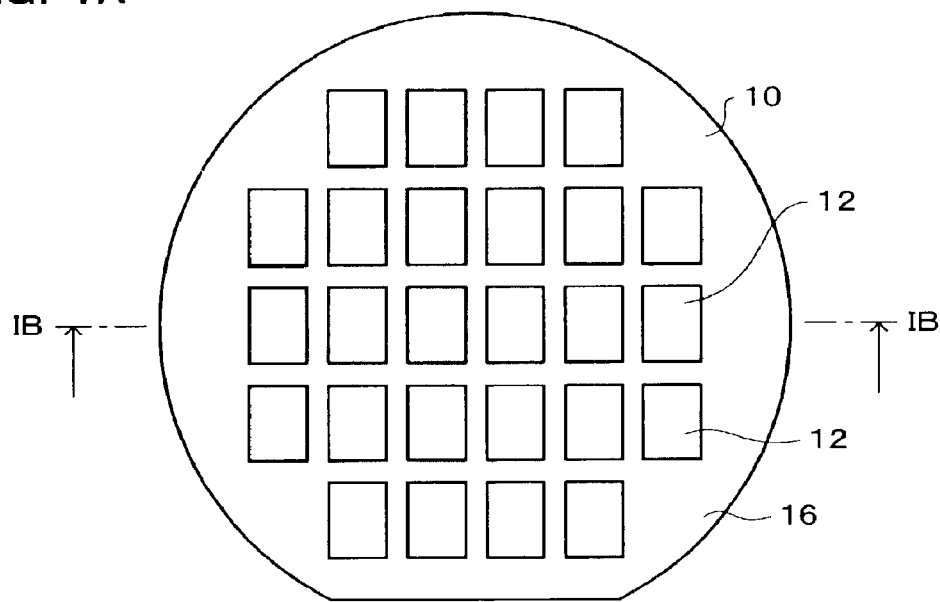
FIGS. 1A to 1C are diagrams illustrating a mask in accordance with one embodiment of the present invention.

Embodiments of the present invention may provide a mask with high precision and its manufacturing method, an EL device and its manufacturing method, and an electronic instrument.

(1) A method of manufacturing a mask according to one embodiment of the present invention comprises:

forming an etching resistant film having a plurality of openings having a polygonal shape on surfaces of a monocrystal substrate having Miller indices {110}, each side of the openings being parallel to one of the {111} planes; and forming a plurality of penetrating holes in the monocrystal substrate within the openings by etching;

wherein the etching has a crystal orientation dependence that the etching speed with respect to the {111} planes is slower than the etching speed with respect to the {100} and {110} planes.

In accordance with this embodiment, each side of the openings formed in the etching resistant film is parallel to one of the {111} planes. Then, the etching having a crystal orientation dependence is performed inside the openings, in a direction perpendicular to the {110} planes of the monocrystal substrate. Thus, since the penetrating holes perpendicular to the top surface of the monocrystal substrate can be formed, the mask with high precision can be manufactured.

(2) In this method of manufacturing a mask, opposite surfaces of the monocrystal substrate may be the {110} planes;

the etching resistant film having the openings may be formed on the opposite surfaces; and the etching may be advanced in the opposite surfaces of the monocrystal substrate, depressed portions formed by the etching being made into penetrating holes.

(3) In this method of manufacturing a mask, the openings may include first openings formed on one surface of the monocrystal substrate and second openings formed on the other surface of the monocrystal substrate, the first and second openings being correspondingly disposed to each other.

(4) In this method of manufacturing a mask,
the second openings may be smaller than the first openings, and formed inside a projecting area of the first openings.

Thus, the positioning of the first and second openings can be done more easily.

(5) In this method of manufacturing a mask,
the shape of each of the openings may be a parallelogram.

(6) In this method of manufacturing a mask,
the thickness W of the monocrystal substrate and the length L of a long side of the parallelogram may have the relationship:

$$\sqrt{3} \times W < L.$$

(7) In this method of manufacturing a mask,
the penetrating holes may be formed by forming small penetrating holes in the monocrystal substrate by an energy beam, and then enlarging the small penetrating holes by the etching.

Thus, the penetrating hole can be formed even in a thick monocrystal substrate.

(8) In this method of manufacturing a mask,
mirror polishing may be carried out for the {110} plane of the monocrystal substrate.

(9) In this method of manufacturing a mask,
the monocrystal substrate may be a monocrystal silicon substrate.

(10) In this method of manufacturing a mask,
the etching resistant film may be formed of silicon oxide or silicon nitride.

(11) In this method of manufacturing a mask,
an organic amine-based alkali aqueous solution and an inorganic alkali aqueous solution may be used as an etchant.

(12) This method of manufacturing a mask may further comprise forming a magnetic film on the monocrystal substrate after the penetrating holes are formed.

Thus, the mask able to be adsorbed by magnetic force can be manufactured.

(13) This method of manufacturing a mask may further comprise forming a thin portion in a region in which the penetrating holes are formed, within the monocrystal substrate.

Thus, the length of the penetrating hole in its axial direction can be shorter than the size of opening (e.g. width) of the penetrating hole. Further, strength can be held if the portion except the region in which the penetrating hole is formed is the thick wall in the monocrystal substrate.

(14) In this method of manufacturing a mask,
the thin portion may be formed avoiding an edge portion of the monocrystal substrate.

Thus, the edge portion of the monocrystal substrate is part of the thick wall so that strength can be held.

(15) In this method of manufacturing a mask,
the etching resistant film may be formed to have a first portion which is in a region except a region in which the thin portion is formed, and a second portion which is thinner than the first portion and is disposed in a region in which the thin portion is formed, the openings being formed in the second portion; and
the etching may be carried out to remove the second portion first, an exposed portion in the first portion being then etched to form the thin portion.

Thus, the thin portion and the penetrating hole can be formed by forming the etching resistant film only once.

(16) In this method of manufacturing a mask,
the thin portion may be formed after the penetrating holes are formed.

(17) In this method of manufacturing a mask,
the thin portion may be formed by etching with no crystal orientation dependence.

This configuration makes it possible to form the thin portion into a desired shape irrespective of the crystal orientation.

(18) In this method of manufacturing a mask,
a plurality of the thin portions may be formed in the monocrystal substrate, and each of the thin portions may be formed in a region including a group of the penetrating holes.

(19) A mask according to one embodiment of the present invention comprises:
a monocrystal substrate having opposite surfaces having Miller indices {110}; and
a plurality of penetrating holes formed in the monocrystal substrate,
wherein the openings have a polygonal shape, each side of the openings being parallel to a plane in a group of the {111} planes; and
wherein inside walls of the penetrating holes are the {111} planes.

In accordance with this embodiment of the present invention, a mask pattern can be formed with high precision since the penetrating holes are formed perpendicularly to the opposite surfaces of the monocrystal substrate.

(20) In this mask,
the shape of each of the openings may be a parallelogram.

(21) In this mask,
the thickness W of the monocrystal substrate and the length L of a long side of the parallelogram may have the relationship:

$$\sqrt{3} \times W < L.$$

(22) In this mask,
the monocrystal substrate may be a monocrystal silicon substrate.

(23) This mask may further comprise a magnetic film formed on the monocrystal substrate.

Thus, the mask can be adsorbed by magnetic force.

(24) In this mask,
a thin portion may be formed in a region in which the penetrating holes are formed, within the monocrystal substrate.

In accordance with this configuration, the length of the penetrating hole in its axial direction can be shorter than the size of opening (e.g. width) of the penetrating hole. Further, strength can be held if the portion except the region in which the penetrating holes are formed is the thick wall in the monocrystal substrate.

(25) In this mask,
the thin portion may be formed avoiding an edge portion of the monocrystal substrate.

Thus, the edge portion of the monocrystal substrate is part of the thick wall so that strength can be held.

(26) In this mask,
a plurality of the thin portions may be formed in the monocrystal substrate; and
each of the thin portions may be formed in a region including a group of the penetrating holes.

(27) A method of manufacturing an electro-luminescence device according to one embodiment of the present invention comprises forming a film of a light emitting material using the above-described mask.

(28) An electro-luminescence device according to one embodiment of the present invention is manufactured by the above-described method.

(29) An electro-luminescence device according to one embodiment of the present invention comprises a plurality of light emitting layers each having an upper surface formed in a polygonal shape except a rectangle, wherein the angle of each corner of the polygonal shape is substantially equal to the intersection angle between two planes among the planes having Miller indices {111}.

(30) In this EL device, the polygonal shape may be a parallelogram.

(31) An electronic instrument according to one embodiment of the present invention has the EL device.

The preferred embodiments of the present invention will next be explained with reference to the drawings.

First Embodiment

Figure 1B:
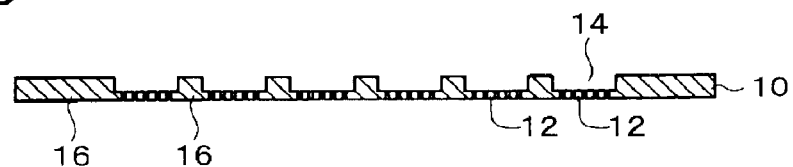
Figure 1C:
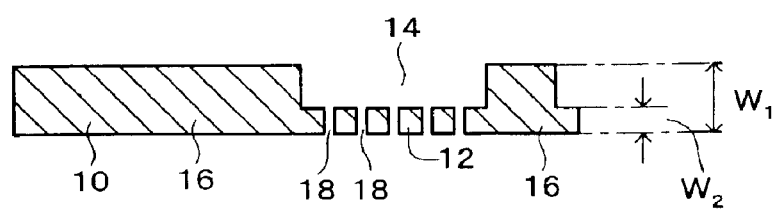

FIGS. 1A to 1C are diagrams illustrating a mask in accordance with one embodiment of the present invention. FIG. 1B is a sectional view taken along an IB—IB line of FIG. 1A. FIG. 1C is a partially enlarged view of FIG. 1B. The mask has a monocrystal substrate 10 (or is formed by only the monocrystal substrate 10). For example, the monocrystal substrate 10 is a monocrystal silicon substrate, or may be a silicon wafer. The monocrystal substrate 10 has surfaces having Miller indices {110} For example, the top and bottom surfaces of the monocrystal substrate 10 are {110} planes. The {110} planes includes a plurality of planes equivalent to a (110) plane. In a cubic lattice, directions perpendicular to the {110} planes are <110> directions.

The monocrystal substrate 10 includes at least one (e.g., plural) thin portion 12. A plurality of the thin portions 12 may be provided in a matrix. The monocrystal substrate 10 except the thin portion 12 is a thick portion 16. Strength of the monocrystal substrate 10 is held by the thick portion 16. The thin portion 12 is formed avoiding an edge portion of the monocrystal substrate 10. Namely, the edge portion of the monocrystal substrate 10 is part of the thick portion 16. Since the thin portion 12 is surrounded by the thick portion 16, no thin portion 12 is easily deformed.

The thin portion 12 is located in a position biased on one surface in the thickness direction of the monocrystal substrate 10. Namely, the thin portion 12 is the bottom portion of a depressed portion 14 formed on one surface (one of the opposite surfaces) of the monocrystal substrate 10. In this case, the thin portion 12 and the other portion (or thick portion 16) in the monocrystal substrate 10 are located in the same level on a surface opposite to the surface on which the depressed portion 14 is formed. As a modified example, the depressed portion may be also formed in corresponding positions on opposite surfaces (top and bottom surfaces) of the monocrystal substrate 10. In this case, the thin portion is located in the center in the thickness direction of the monocrystal substrate 10.

As shown in FIG. 1C, plural penetrating holes 18 are formed in the monocrystal substrate 10. A region in which the penetrating holes 18 are formed is made into the thin portion 12. A group of the penetrating holes 18 is formed in one thin portion 12.

Figure 2A:
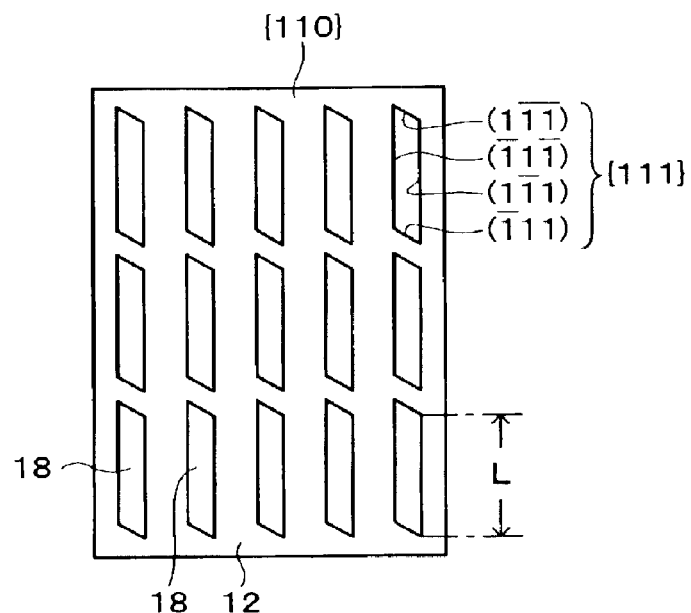
FIG. 2A is a plan view of a penetrating hole.
Figure 2B:
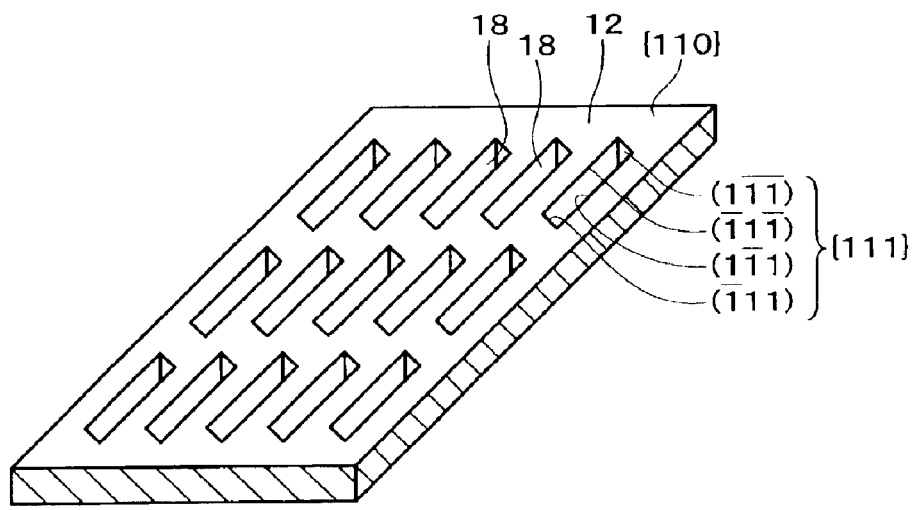
FIG. 2B is a perspective view of the penetrating hole.

FIG. 2A is a plan view of a penetrating hole, and FIG. 2B is a perspective view of the penetrating hole. As mentioned above, the surfaces of the monocrystal substrate 10 are the {110} planes. A shape of the penetrating hole 18 is a polygon except a rectangle. A shape of the penetrating hole 18 shown in FIG. 2A is a parallelogram, and the length L of its long side and the thickness $W_1$ (see FIG. 1C) of the monocrystal substrate 10 (or the thick portion 16 specifically) have the relationship: $\sqrt{3} \times W_1 < L$. As a modified example, the length L of the long side of the parallelogram and the thickness $W_2$ (see FIG. 1C) of the thin portion 12 of the monocrystal substrate 10 may have the relationship: $\sqrt{3} \times W_2 < L$.

Each side of the opening of the penetrating hole 18 is parallel to one of the {111} planes (specifically shown in FIGS. 2A and 2B). In a cubic lattice, directions perpendicular to the {111} planes are <111> directions.

Figure 2C:
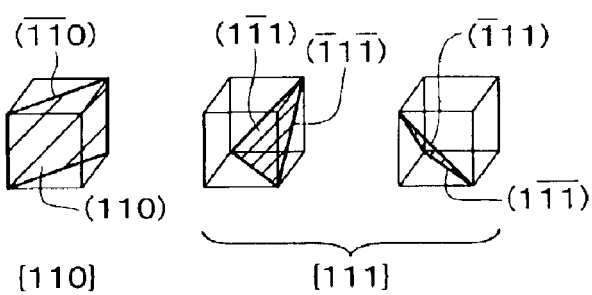
FIG. 2C is a diagram illustrating a crystal plane by using Miller indices.

FIG. 2C is a diagram illustrating a crystal plane by using Miller indices. As can be seen from FIG. 2C, the {110} planes perpendicularly intersect the {111} planes. The wall surface of the penetrating hole 18 is one of the {111} planes (an example is shown in FIGS. 2A and 2B). Accordingly, the penetrating hole 18 is disposed perpendicularly to the top and bottom surfaces of the monocrystal substrate 10 (the {110} planes). Since the penetrating hole 18 is formed perpendicularly to the top and bottom surfaces of the monocrystal substrate 10, a mask pattern is formed with high precision.

FIGS. 3A to 3F are diagrams illustrating a method of manufacturing a mask in accordance with one embodiment of the present invention. In this embodiment, the monocrystal substrate 10 is prepared in a state prior to the formation of the penetrating hole 18, etc. For example, the monocrystal substrate 10 is a monocrystal silicon substrate, and may be also a silicon wafer. The monocrystal substrate 10 has surfaces having Miller indices {110}. For example, the top and bottom surfaces (opposite surfaces) of the monocrystal substrate 10 are the {110} planes. Mirror polishing may be carried out for at least the top surface (or opposite surfaces) of the monocrystal substrate 10.

Figure 3A:
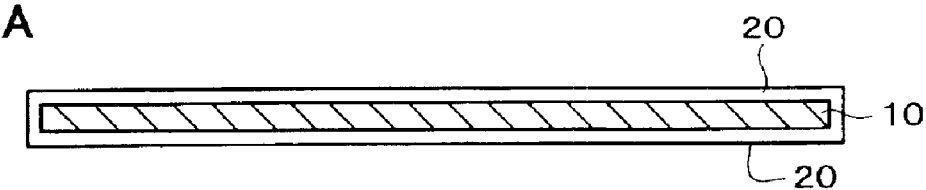
FIGS. 3A to 3F are diagrams illustrating a method of manufacturing a mask in accordance with one embodiment of the present invention.

As shown in FIG. 3A, an etching resistant film 20 (e.g., a thickness of about 1 μm) is formed in the monocrystal substrate 10. The etching resistant film 20 is formed on each of the top and bottom surfaces (opposite surfaces) of the monocrystal substrate 10. The etching resistant film 20 may be arranged so as to continuously cover the entire surface of the monocrystal substrate 10. The etching resistant film 20 may be formed by silicon oxide and silicon nitride using thermal oxidation processing.

Figure 3B:
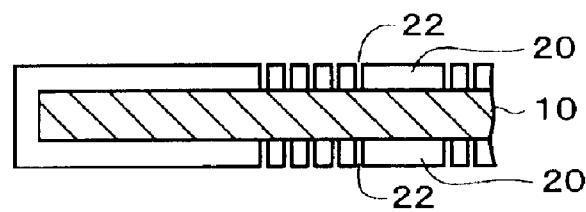

As shown in FIG. 3B, a plurality of openings 22 are formed in the etching resistant film 20. A pair of openings 22 is oppositely provided on the top and bottom surfaces (opposite surfaces) of the monocrystal substrate 10. Each of the openings 22 is formed so as to have the same shape as the penetrating hole 18 in a position in which the penetrating hole 18 is formed. The opening 22 is formed in a polygonal shape (e.g., a parallelogram). Each side of the opening 22 is located in parallel with one of the {111} planes. The other details about the shape of the opening 22 are the same as the penetrating hole 18. Photolithography can be applied to the formation of the opening 22.

Figure 3C:
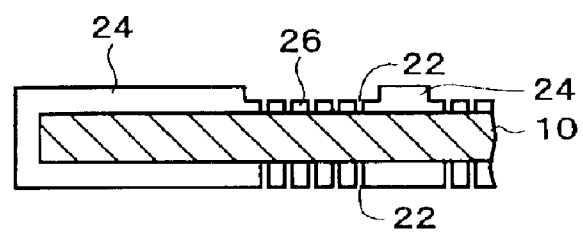

As shown in FIG. 3C, the etching resistant film 20 is patterned so as to have a first portion 24 avoiding an area for forming the thin portion 12, and a second portion 26 arranged in the area for forming the thin portion 12 and thinner than the first area 24. The photolithography may be also applied to this patterning. When the patterning is terminated, the opening 22 is located in the second portion 26. The outer shapes (planar shapes) of the first and second portions 24, 26 are respectively the same as the outer shapes (planar shapes) of the thick portion 16 and the thin portion 12.

The monocrystal substrate 10 is then etched with the etching resistant film 20 having the first and second portions 24, 26 as a mask. The etching applied here is anisotropic etching, and has a crystal orientation dependence that the etching speed with respect to the {111} planes is slower than the etching speed with respect to the {100} and {110} planes (e.g., slower by 10 times or more, preferably 100 times or more). Note that a 15 percent potassium hydroxide solution heated to about 80° C. may be used as an etchant. When it is desirable to avoid potassium, an organic amine-based alkali aqueous solution, e.g., 10 to 20 percent by weight aqueous solution of tetramethyl ammonium hydroxide may be used as an etchant. Otherwise, an inorganic alkali aqueous solution except the potassium hydroxide aqueous solution, e.g., ammonia water may be also used. In this embodiment, since there are exposed portions by the openings 22 on the opposite surfaces of the monocrystal substrate 10, the etching is advanced on the opposite sides.

Figure 3D:
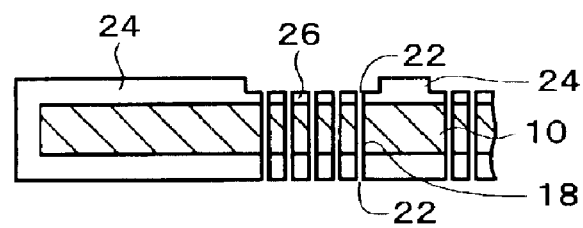

As shown in FIG. 3D, the penetrating hole 18 is formed within the opening 22 of the etching resistant film 20. The thickness $W_1$ (see FIG. 1C) of the monocrystal substrate 10 and the length L of a long side of the parallelogram of the opening 22 (the same as the length L of a long side of the parallelogram of the penetrating hole 18 shown in FIG. 2A) have the relationship: $\sqrt{3} \times W_1 < L$. Accordingly, the depressed portion formed by the etching can be penetrated without intermediately stopping the etching from the opposite sides.

Figure 3E:
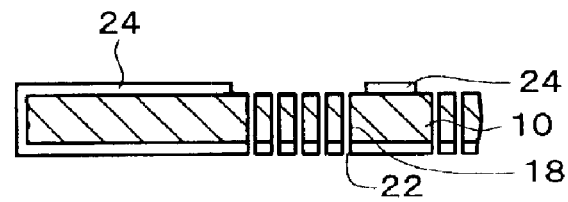

As shown in FIG. 3E, the second portion 26 is early removed in comparison with the first portion 24 by reducing the thickness of the etching resistant film 20. This process may be also performed by the etching. Thus, the monocrystal substrate 10 forming the penetrating hole 18 therein is covered with the first portion 24 among the etching resistant film 20. The surface of the monocrystal substrate 10 exposed by removing the second portion 26 is a forming area of the thin portion 12.

Figure 3F:
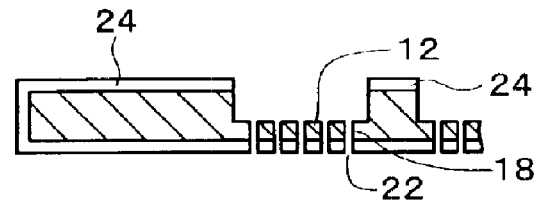

As shown in FIG. 3F, the thin portion 12 can be formed by etching the exposed surface from the first portion 24 in the monocrystal substrate 10. If etching having no crystal orientation dependence is applied as this etching, the thin portion 12 having a desired shape can be formed. In this embodiment, after the penetrating hole 18 is formed, the thin portion 12 is formed. Since the details of the thin portion 12 have been described above, its explanation is omitted here. The mask shown in FIGS. 1A to 1C can be manufactured by removing the etching resistant film 20 (first portion 24 in detail).

In accordance with this embodiment, each side of the opening 22 formed in the etching resistant film 20 is parallel to one of the {111} planes. Then, the etching having a crystal orientation dependence is performed inside the opening 22, in a direction perpendicular to the {110} planes of the monocrystal substrate 10. Thus, since the penetrating hole 18 perpendicular to the top surface of the monocrystal substrate 10 can be formed, the mask with high precision can be manufactured.

In this embodiment, the thin portion 12 is formed, but the present invention includes an example in which no thin portion 12 is formed. When no thin portion 12 is formed, the forming process of the second portion 26 shown in FIG. 3C and the processes after FIG. 3E are not required.

Second Embodiment

Figure 4A:
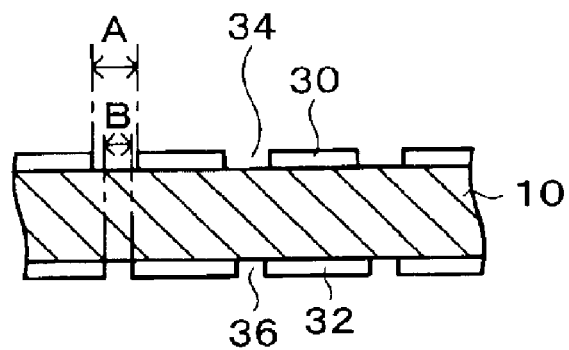
FIGS. 4A to 4C are diagrams illustrating a method of manufacturing a mask in accordance with a second embodiment of the present invention.
Figure 4B:
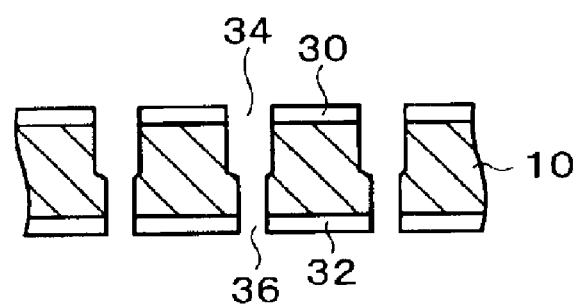
Figure 4C:
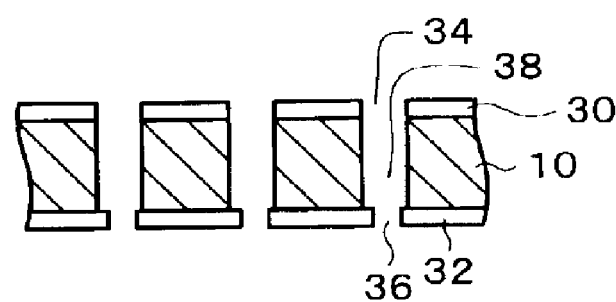

FIGS. 4A to 4C are diagrams illustrating a method of manufacturing a mask in accordance with a second embodiment of the present invention. In the first embodiment, the openings 22 are formed in the etching resistant film 20 on opposite surfaces of the monocrystal substrate 10. In this case, since it is difficult to align the positions of the openings 22 on opposite sides, a method for simply aligning these positions will next be mainly explained.

As shown in FIG. 4A, a first opening 34 is formed in an etching resistant film 30 formed on one surface of the monocrystal substrate 10, and a second opening 36 is formed in an etching resistant film 32 formed on the other surface. Here, the widths A, B of the first and second openings 34, 36 have the relationship: B<A. Accordingly, it is sufficient to form the second opening 36 inside a projecting area of the first opening 34. Its positioning is simpler than the alignment of the openings of the same size. Thus, the first opening 34 on one side and the second opening 36 on the other side are correspondingly formed in the above etching resistant films 30, 32 respectively formed on opposite surfaces of the monocrystal substrate 10. The etching is advanced as shown in FIG. 4B, and a penetrating hole 38 is formed as shown in FIG. 4C. As shown in FIG. 4C, part of the etching resistant film 32 defining the second opening 36 of a smaller size is projected inside the penetrating hole 38, but the etching resistant film 32 may be removed. The contents explained in this embodiment can be applied to the first embodiment.

Third Embodiment

Figure 5:
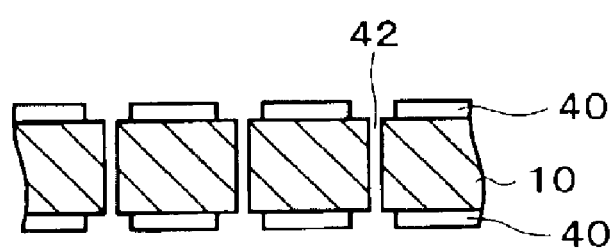
FIG. 5 is a diagram illustrating a method of manufacturing a mask in accordance with a third embodiment of the present invention.

FIG. 5 is a diagram illustrating a method of manufacturing a mask in accordance with a third embodiment of the present invention. In the first embodiment, the thickness $W_1$ (see FIG. 1C) of the monocrystal substrate and the length L of a long side of the parallelogram of the opening 22 of the etching resistant film 20 (the same as the length L of alongside of the parallelogram of the penetrating hole 18 shown in FIG. 2A) have the relationship: $\sqrt{3} \times W_1 < L$. The penetrating hole can be formed in such a comparatively thin monocrystal substrate. However, in a monocrystal substrate thicker than this comparatively thin monocrystal substrate, the etching is intermediately stopped so that no penetrating hole can be formed.

In this embodiment, the forming method of the penetrating hole will be explained when the relationship: $\sqrt{3} \times W_1 \geq L$ is formed (when the monocrystal substrate is thick).

As shown in FIG. 5, a small penetrating hole (a hole smaller than the penetrating hole) 42 is formed in advance before the etching in a forming area of the penetrating hole in the monocrystal substrate 10 (an exposed surface from a patterned etching resistant film 40). The small penetrating hole 42 is formed by an energy beam (e.g., YAG laser). Thus, since a corner portion is formed in an opening portion of the small penetrating hole 42, the penetrating hole can be formed without stopping the advancement of the etching. The contents explained in this embodiment can be applied to the first embodiment.

Fourth Embodiment

Figure 6:
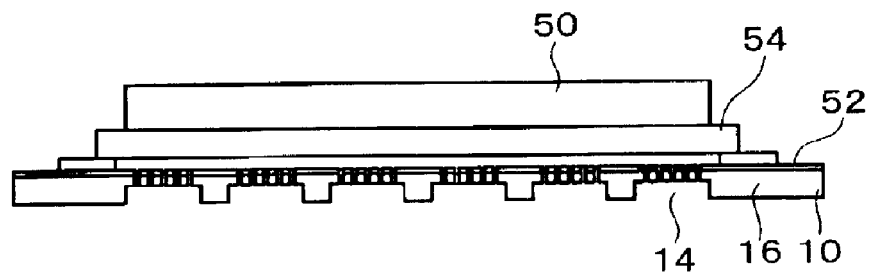
FIG. 6 is a diagram illustrating a method of manufacturing a mask and an EL device in accordance with a fourth embodiment of the present invention.

FIG. 6 is a diagram illustrating a method of manufacturing a mask and an EL device in accordance with a fourth embodiment of the present invention. A magnetic film 52 is formed in the mask 10 shown in FIG. 6. The magnetic film 52 can be formed by a ferromagnetic material such as iron, cobalt, and nickel. Other wise, the magnetic film 52 may be also formed by a magnetic metal material such as Ni, Co, Fe, and a stainless steel alloy including an Fe component, and bonding of the magnetic metal material and a nonmagnetic metal material. The other details of the mask 10 have been explained in the first embodiment.

Figure 7A:
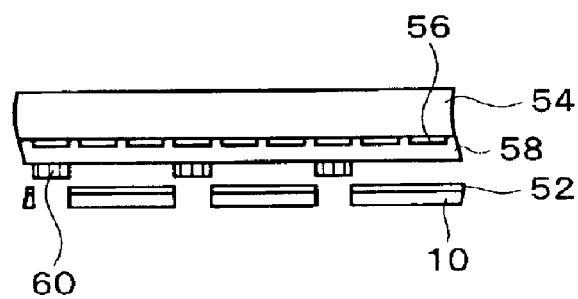
FIGS. 7A to 7C are diagrams illustrating a method of forming a film of a light emitting material.

In this embodiment, the film of a light emitting material is formed in a substrate 54 by using the mask 10. The substrate 54 is arranged for an EL device (e.g., organic EL device) and is a transparent substrate such as a glass substrate. As shown in FIG. 7A, an electrode (e.g., a transparent electrode constructed by ITO, etc.) 56 and a positive hole transport layer 58 are formed in the substrate 54. An electronic transport layer may be also formed. The mask 10 is arranged such that the depressed portion 14 is directed on the side opposed to the substrate 54. Namely, a flat surface of the mask 10 is directed to the substrate 54 side. A magnet 50 is arranged behind the substrate 54 so as to attract the magnetic film 52 formed in the mask 10. Thus, even when a warp is caused in the mask 10, this warp can be corrected.

Figure 7B:
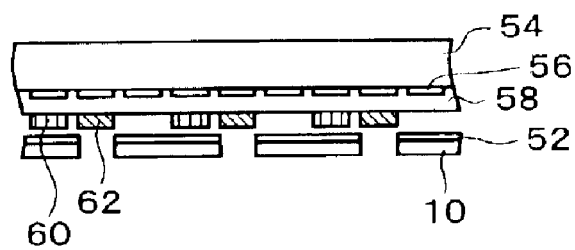
Figure 7C:
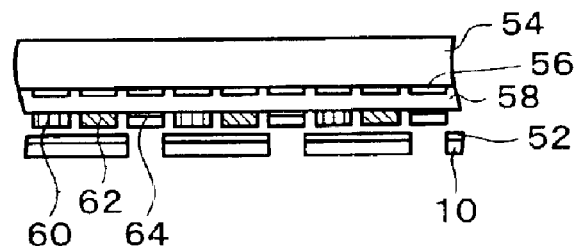

FIGS. 7A to 7C are diagrams illustrating a method of forming a film of a light emitting material. For example, the light emitting material is an organic material, and there is alumiquinolinol complex ($Alq_3$) as the organic material of low molecule, and there is polyparaphenylene vinylene (PPV) as the organic material of high molecule. The film of the light emitting material can be formed by evaporation. For example, as shown in FIG. 7A, while a red light emitting material is patterned through the mask 10, the film is formed and a red light emitting layer 60 is formed. As shown in FIG. 7B, while the mask 10 is shifted and a green light emitting material is patterned, the film is formed and a green light emitting layer 62 is formed. As shown in FIG. 7C, while the mask 10 is again shifted and a blue light emitting material is patterned, the film is formed and a blue light emitting layer 62 is formed.

Figure 8A:
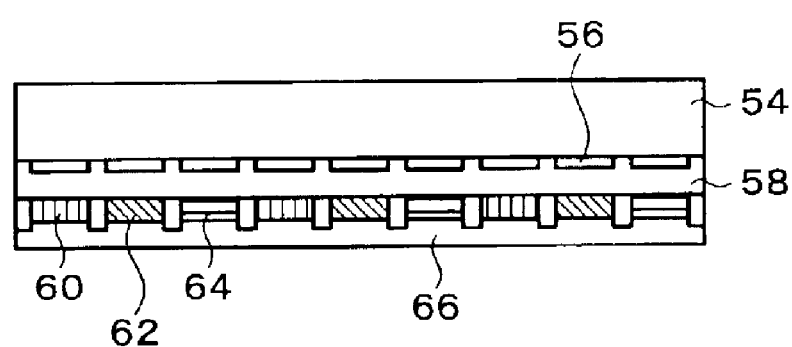
FIGS. 8A and 8B are diagrams illustrating an EL device manufactured by utilizing the method of forming a film of a light emitting material according to the present invention.
Figure 8B:
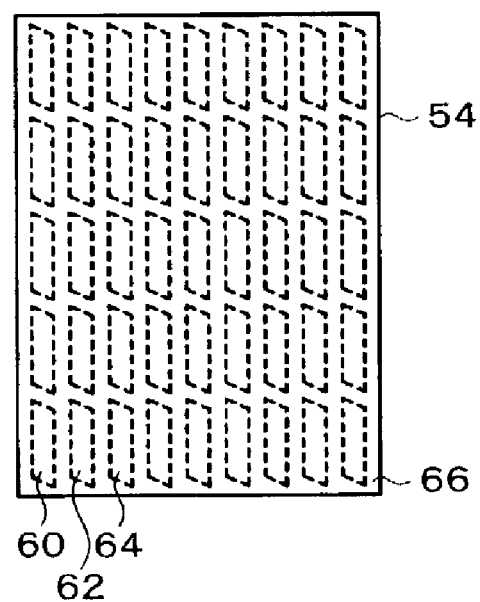

FIGS. 8A and 8B are diagrams illustrating an EL device manufactured by utilizing the above-described method of forming a film of alight emitting material. The EL device (e.g., organic EL device) has a substrate 54, an electrode 56, a positive hole transport layer 58, light emitting layers 60, 62, 64, etc. As shown in FIG. 8B, the shape of upper surface of each of the light emitting layers 60, 62, 64 is a polygon (e.g., a parallelogram) except a rectangle. This shape corresponds to the shape of the penetrating hole 18 of the mask 10. The details have been described in the first embodiment. Further, an electrode 66 is formed on the light emitting layers 60, 62, 64. For example, the electrode 66 is a cathode electrode. The EL device (EL panel) becomes a display device (display).

Figure 9:
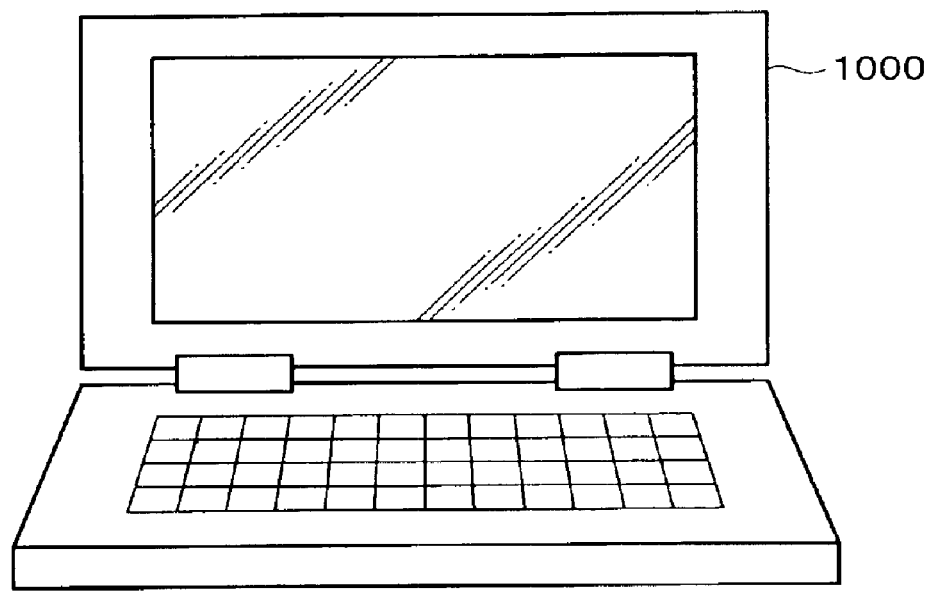
FIG. 9 shows an electronic instrument in accordance with one embodiment of the present invention.
Figure 10:
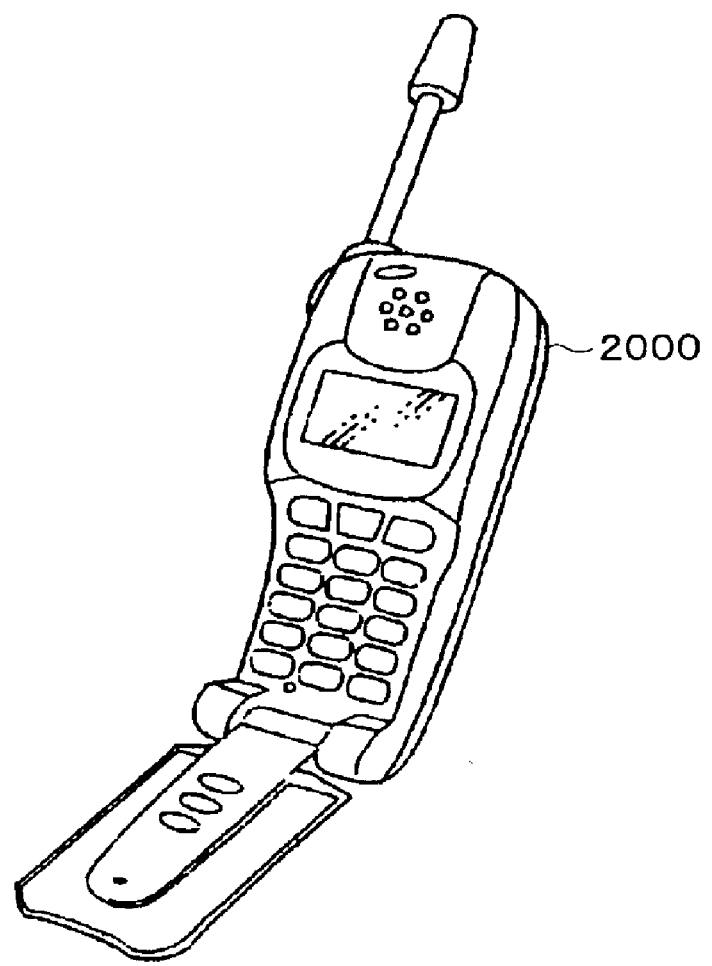
FIG. 10 shows an electronic instrument in accordance with one embodiment of the present invention.

A notebook personal computer 1000 is shown in FIG. 9 and a portable telephone 2000 is shown in FIG. 10 as an electronic instrument having an EL device in accordance with one embodiment of the present invention.

Note that this invention is not limited to the embodiments described above and thus it can be implemented in many various ways. For example, the present invention includes various other configurations substantially the same as the configurations described in the embodiments (in function, method and result, or in objective and result, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a mask comprising:
    forming an etching resistant film having a plurality of openings having a polygonal shape on surfaces of a monocrystal substrate having Miller indices {110}, each side of the openings being parallel to one of the {111} planes; and
    forming a plurality of penetrating holes in the monocrystal substrate within the openings by etching;
    wherein:
    the etching has a crystal orientation dependence that the etching speed with respect to the {111} planes is slower than the etching speed with respect to the {100} and {110} planes;
    opposite surfaces of the monocrystal substrate are the {110} planes;
    the etching resistant film having the openings is formed on the opposite surfaces;
    the etching is advanced in the opposite surfaces of the monocrystal substrate, depressed portions formed by the etching being made into penetrating holes
    the openings include first openings formed on one surface of the monocrystal substrate and second openings formed on the other surface of the monocrystal substrate, the first and second openings being correspondingly disposed to each other; and
    the second openings are smaller than the first openings, and are formed inside a projecting area of the first openings.

2. The method of manufacturing a mask as defined in claim 1,
    wherein the shape of each of the openings is a parallelogram.

3. The method of manufacturing a mask as defined in claim 2,
    wherein the thickness W of the monocrystal substrate and the length L of a long side of the parallelogram have the relationship: $\sqrt{3} \times W < L$.

4. The method of manufacturing a mask as defined in claim 1,
    wherein the penetrating holes are formed by forming small penetrating holes in the monocrystal substrate by an energy beam, and then enlarging the small penetrating holes by the etching.

5. The method of manufacturing a mask as defined in claim 1,
    wherein mirror polishing is carried out for the {110} plane of the monocrystal substrate.

6. The method of manufacturing a mask as defined in claim 1,
    wherein the monocrystal substrate is a monocrystal silicon substrate.

7. The method of manufacturing a mask as defined in claim 1,
    wherein the etching resistant film is formed of silicon oxide or silicon nitride.

8. The method of manufacturing a mask as defined in claim 1,
    wherein an organic amine-based alkali aqueous solution or an inorganic alkali aqueous solution is used as an etchant.

9. The method of manufacturing a mask as defined in claim 1, further comprising:
    forming a magnetic film on the monocrystal substrate after the penetrating holes are formed.

10. The method of manufacturing a mask as defined in claim 1, further comprising:
    forming a thin portion in a region in which the penetrating holes are formed, within the monocrystal substrate.

11. The method of manufacturing a mask as defined in claim 10,
    wherein the thin portion is formed avoiding an edge portion of the monocrystal substrate.

12. The method of manufacturing a mask as defined in claim 10, wherein:
    the etching resistant film is formed to have a first portion which is in a region except a region in which the thin portion is formed, and a second portion which is thinner than the first portion and is disposed in a region in which the thin portion is formed, the openings being formed in the second portion; and the etching is carried out to remove the second portion first, an exposed portion in the first portion being then etched to form the thin portion.

13. The method of manufacturing a mask as defined in claim 10,
wherein the thin portion is formed after the penetrating holes formed.

14. The method of manufacturing a mask as defined in claim 10,
wherein the thin portion is formed by etching with no crystal orientation dependence.

15. The method of manufacturing a mask as defined in claim 1, wherein:
a plurality of the thin portions are formed in the monocrystal substrate; and
each of the thin portions is formed in a region including a group of the penetrating holes.

* * * * *